US006397369B1

(12) United States Patent
Despain et al.

(10) Patent No.: US 6,397,369 B1
(45) Date of Patent: May 28, 2002

(54) DEVICE FOR USING INFORMATION ABOUT THE EXTENT OF ERRORS IN A SIGNAL AND METHOD

(75) Inventors: Alvin M. Despain, Los Angeles; R. Stockton Gaines, Pacific Palisades, both of CA (US)

(73) Assignee: Acorn Technologies, Inc., Los Angeles, CA (US)

(*) Notice: Subject to any disclaimer, the term of this patent is extended or adjusted under 35 U.S.C. 154(b) by 0 days.

(21) Appl. No.: 09/187,769

(22) Filed: Nov. 6, 1998

(51) Int. Cl.[7] .......................... G06F 11/00; G06F 11/30; G08C 25/00; H03M 13/00; H04L 1/00
(52) U.S. Cl. ........................ 714/798; 714/746
(58) Field of Search .................. 342/372; 455/103, 455/12.1; 360/46; 714/746, 798

(56) References Cited

U.S. PATENT DOCUMENTS

| 4,404,676 A | * | 9/1983 | DeBenedictus ............. 371/47 |
| 4,661,993 A | * | 4/1987 | Leland ..................... 455/103 |
| 5,233,487 A | * | 8/1993 | Christensen ............. 360/77.04 |
| 5,235,476 A | * | 8/1993 | Mikada et al. ........... 360/78.07 |
| 5,239,668 A | * | 8/1993 | Davis ....................... 455/12.1 |
| 5,321,559 A | * | 6/1994 | Nguyen .................... 360/46 |
| 5,353,031 A | * | 10/1994 | Rathi ....................... 342/372 |
| 5,420,730 A | * | 5/1995 | Moon ..................... 360/77.08 |
| 5,654,766 A | * | 8/1997 | McNay ..................... 348/614 |
| 5,661,760 A | * | 8/1997 | Patapoutian ............... 375/341 |

FOREIGN PATENT DOCUMENTS

| EP | 0 298 475 A1 | 7/1988 |
| EP | 0 331 189 A2 | 3/1989 |
| WO | WO 99/36907 | 7/1999 |

* cited by examiner

Primary Examiner—Albert Decady
Assistant Examiner—Joseph D. Torres
(74) Attorney, Agent, or Firm—Hogan & Hartson L.L.P.

(57) ABSTRACT

A device using information about the extent of errors in a signal is shown. The device includes an input signal containing at least one constraint and any errors introduced into the input signal during transmission and/or sensing. A detector receives and is responsive to the input signal for generating an error signal containing information about the extent of error and for extracting an information signal from the input signal as an output signal. A control device is operatively coupled to the detector for receiving and responding to the error signal containing information about the extent of errors for generating a control signal used to reduce the extent of errors in the input signal based on information about the extent of errors contained in the error signal. A method for using information about the extent of errors is shown.

39 Claims, 4 Drawing Sheets

Fig 8

DEVICE FOR USING INFORMATION ABOUT THE EXTENT OF ERRORS IN A SIGNAL AND METHOD

BACKGROUND OF THE INVENTION

1. Field of the Invention

The invention relates generally to a device using information about errors having one or more input signals each containing at least one constraint and any errors introduced into the input signals during transmission and/or sensing. One or more detectors are responsive to the one or more input signals for generating an error signal containing information about the extent of errors and extracting a data signal which may be used as the output. The generation of the error signal and the extraction of the data signal occur simultaneously from the same input signal. The input signals are generated by a transducer including, but not limited to, antennas and magnetic or optical transducers. The error signal containing information about the extent of errors is applied to a control device for generating a control signal that is used to reduce the extent of errors in the input signal by improving the state of the transducer. An output device may be used, which is responsive to the error signals and to two or more extracted information signals, to derive therefrom an output signal that is a function of the error signal and extracted information signals.

In the preferred embodiment, the device generates an error signal containing information about the extent of errors from the input signal and that error signal is used to reduce the extent of errors in the input signal.

This invention also relates to a method for using information about the extent of errors in one or more input signals to reduce the extent of errors in the input signal or for producing an output signal which is derived from the error signals and two or more extracted information signals.

In another embodiment of the present invention, the input signal may be two or more separate input signals from two or more transducers each containing at least one constraint and any errors introduced into the input signals. Two or more input signals may be applied to separate detectors each of which generates an error signal containing information about the extent of errors and an extracted information signal. A control device receives and is responsive to the error signal containing information about the extent of errors to reduce the extent of errors in the input signals. The extracted information signals and error signals may be applied to an output device which is used to derive an output signal therefrom as a function of information about the extent of errors and two or more extracted information signals.

In yet another embodiment, the output device derives the output signal from the information about the extent of errors in the error signal and from two or more extracted information signals by selecting the extracted information signal having the least number of errors, or by selecting the output signal from a combination thereof in accordance with a processing operation.

In a further embodiment of this invention having two input signals and two detectors, the error signal or error signals from the detector or detectors may be applied to an output device together with information signals extracted by the detector from two or more input signals each containing at least one constraint. The output device produces an output signal derived from the error signals representing the extent of information about errors. The error signals are concurrently applied to a control device which generates a control signal to accommodate for a deficiency of two or more input signals each containing at least one constraint.

This invention has application to apparatus using transducers for producing information bearing input signals containing at least one constraint from a source of input signals. The input signals containing at least one constraint and any errors introduced into the input signal during transmission and/or sensing are applied to a detector which generates an error signal containing information about the extent of errors and which extracts an information signal from the input signal. The extracted information signal is used as the output signal or is used in combination with the error signal and one or more extracted information signals to derive an output signal. The error signal is used as a control signal which is applied to an adjusting element to control an operating condition of the transducer to reduce the extent of errors in the input signal.

One example of the use of the device of the present invention is an apparatus for reading or reproducing data from mass storage devices, such as for example magnetic disc storage systems or optical disc storage systems.

In such mass storage apparatus, a read transducer senses the stored data containing at least one constraint and produces a first signal containing at least one constraint and any information about errors introduced into the input signal during sensing. The first signal is applied to a detector which generates a control signal containing information about the extent of errors and which extracts an information signal from the first signal. The extracted information signal is used as the output signal. The control signal is applied to an adjusting element to control the position of the read transducer to improve alignment between the first transducer and the storage medium. In certain applications, the teachings of this invention can be used for controlling the storing of information on a storage media by controlling the position of the writing transducer relative to the storage media.

The teachings of the present invention also have application for use with transmission apparatus and communication apparatus. In transmission apparatus, one or more input signals containing at least one constraint and any information about errors introduced into the input signal during transmission and/or sensing are applied to a detector. The detector generates an error signal containing information about the extent of errors and extracts an information signal from each input signal. The extracted information signals are used directly as the output signal or are used in combination with the error signal and one or more extracted information signals to derive an output signal. The error signal is used as a control signal which is applied to an adjusting element operatively connected to a transducer to reduce the extent of errors in one or more of the input signals.

In one example of a communication apparatus, an adjustable receiving antenna, which is one form of a transducer, receives and converts an electromagnetic signal to an electrical signal representing the input signal having at least one constraint and any errors introduced into the input signal during the transmission and/or sensing. The input signal is applied to a detector which generates a control signal containing information about the extent of errors and which extracts an information signal from the input signal. The extracted information signal is used directly as the output signal. The control signal is applied to an adjusting element to control the position, e.g. direction and angle of the adjustable receiving antenna to reduce the number of errors in the input signal.

In another example of a communication apparatus, an adjustable transmitting antenna, which is one form of a transducer, converts a signal containing at least one constraint into an electromagnetic signal and transmits the same to an adjustable receiving antenna. The adjustable receiving antenna converts the electromagnetic signal back to an electrical signal representing the input signal having at least one constraint and any errors introduced into the input signal during the transmission and/or sensing. The input signal is applied to a detector which generates a control signal containing information about the extent of errors and which extracts an information signal from the input signal. The extracted information signal is used directly as the output signal. The control signal is applied to adjusting elements to adjust the electrical or physical state of the transmitting and/or receiving antennas to improve the transmission between them, and as a consequence to reduce the number of errors in the input signal. Information about the extent of errors in the input signal is passed to the transmitter through a reverse channel.

In the foregoing communications examples, the antennas may be adjusted electrically or physically in response to the control signal. One type of electrically adjustable antenna is a phased array antenna, in which the orientation of the antenna is accomplished electrically. More generally, transducers may be adjusted physically or electrically in response to the control signal.

2. Description of the Prior Art

It is known in the art to generate input signals containing at least one constraint.

In magnetic storage apparatus, typically such input signals are encoded using known encoding processes. One example of stored data in a magnetic storage medium containing at least one constraint uses partial response maximum likelihood ("PRML") encoding and a magnetic transducer or magnetic transducers reproducing data from such magnetic media.

It is also known to use PRML encoding and error correcting codes ("ECC") for encoding signals for transmission and communications apparatus.

It is also known in the art to use a detector for receiving and processing encoded signals and to extract an output signal from the input signal.

U.S. Pat. No. 5,233,487 discloses a rotating media storage system that compensates for thermal and mechanical errors in the position of the data detector, or read head, with respect to the written data. The compensation is accomplished by measuring the error rate of written data as a function of the read offset of the detector in that error rates become increasingly large as the sensed noise to signal ratio becomes large. As the offset of the head becomes misaligned with the track, the sensed noise to signal ratio increases. When the data storage system is initially activated, the detector counts the number of errors detected in reading written data for various read offsets. When the number of errors reaches a target rate, the read offset corresponding to the target rate is saved. The procedure is performed on either side of the data track. During operation of the storage system, thermal and mechanical operational errors occur in the system and similar error rate data and offset data are developed for these operational conditions. The so developed error rate and target error rate are used to cause the read transducer to be re-centered with respect to the write transducer position between the new offsets on either side of the tracks.

The method disclosed in U.S. Pat. No. 5,233,487 is based on the principal that sensing signals outside of the write width is deemed an off-track read, and when enough of the read widths are outside of the write width, an error in reading data is deemed to have occurred. An ECC detection/correction means senses the error in blocks of data and a counter maintains a count of the number of errors. When the errors reach a predetermined error rate, the read transducer position is adjusted to optimize detector read performance. As such, adjustment of the read head relative to the data track occurs only after the number of counted errors exceeds a predetermined number of errors.

In the prior art, as exemplified in U.S. Pat. No. 5,233,487, the rate of errors is determined in order to calibrate the transducer position. Then data is obtained without further adjustment. Thereafter periods of calibration and adjustment are interspersed with periods in which the signal from the transducer is used to only generate an output.

U.S. Pat. No. 4,404,676 discloses a method using a data-dependent code word consisting of redundancy bits, that marks a boundary of a multi-bit cell. The data-dependent code word is coded to bear a "mapping relationship" to a data block within the cell. Embodiments using the data-dependent code word provide various types of synchronization. Decoders provide block and bit synchronization for either serial-by-bit data signal or a serial-by-byte data signal. U.S. Pat. No. 4,404,676 further discloses that the preferred embodiment is used in a record/playback system for storing on a storage medium and subsequently deriving the stored information from the storage medium.

In the system disclosed in U.S. Pat. No. 4,404,676, encoding means and decoding means are used, each of which utilizes a data-dependent boundary-marking code word bearing a predetermined mapping relationship to a data block of a cell and otherwise being indistinguishable from arbitrarily selected groups of data bits. The object of U.S. Pat. No. 4,404,676 is to solve synchronization problems and not to provide for adjusting head or transducer position or deriving a data signal having the least amount of errors from two or more extracted information signals representing the input signals.

The system and method disclosed in U.S. Pat. No. 4,404,676 has several limitations when applied to magnetic data storage systems. During reproduction of the data in such a system, it is necessary to produce a plurality of individually identifiable clock signals and each clock signal has reoccurring clock pulses with the clock pulses of each such clock signal differing from those of each other clock pulses as to the time of occurrence. The clock pulses are required to sample a data signal and to derive a plurality of sample bits that are congregated and tested. The system includes means for generating a candidate-valid signal for each candidate cell that is determined, by such testing, to be a valid cell. As each candidate cell undergoes such testing, that testing determines whether the code-word portion of the candidate cell bears the predetermined mapping relationship to its block-length portion as is characteristic of a valid cell. Since this system is based on a serial-by-bit data signal or a serial-by-byte data signal method, the system is not designed and is unable to produce a position error signal, or to derive a signal from among multiple input signals.

SUMMARY OF THE PRESENT INVENTION

The present invention discloses a new, novel and unique device for using information about the extent of errors in a signal. The device comprises an input signal containing at least one constraint and any errors introduced into the input signal during transmission and/or sensing. A detector is responsive to the input signal for generating an error signal containing information about the extent of errors and for extracting an information signal from the input signal which is used as an output signal. A control device is operatively coupled to the detector for receiving and responding to the error signal containing information about the extent of errors for generating a control signal used to modify the state of the transducer to reduce the extent of errors in the input signal based on the information about the extent of errors contained in the error signal.

This device has application in several fields such as for example, in storage systems, information transmission systems and communication systems.

This invention is based on the principal that when at least one constraint is added to information signal, this constitutes prior knowledge of the expected information signal in the absence of noise or other impairments. Such knowledge can be exploited, such as for example, by making a computation or comparison between the expected information signal including the at least one constraint and the observed information signal including the at least one constraint. Such computation or comparison is used to develop an error signal representing the extent of errors in the input signal during transmission and/or sensing. The so developed error signal can be used to develop a control signal, for example, in the form of a substantially continuous position error signal, which is used to reduce the extent of errors in the input signal using conventional apparatus and methods, e.g., adjust transducer position so as to improve the input signal characteristics.

In one embodiment using a transducer, the device for using information about the extent of errors includes a first transducer for generating a first signal representative of data containing at least one constraint and any errors introduced into the first signal during transmission and/or sensing. The apparatus includes an input device responsive to the first signal for generating a control signal containing information about the extent of errors in the first signal and for extracting an information signal. A control device is operatively coupled to the input device for receiving the error signal and for performing a control function in response thereto to improve the extracted data signal as a function of the extent of errors in the sensed data.

The control device may be responsive to the error signal to produce a dynamic servo signal, which may be in the form of a substantially continuous servo signal, which is used to improve alignment of the first transducer relative to the source of the signal received by the transducer. In one embodiment information about the extent of errors may be used to generate a position error signal for adjusting, through a servo system, the alignment of a read transducer with a track in a magnetic disc storage system.

The apparatus may include a second transducer for generating a second signal representative of information containing at least one constraint and any errors introduced into the second signal during transmission and/or sensing. In this apparatus, the second detector generates an error signal from the second signal and extracts a second information signal.

The detector also produces an extracted first information signal and an extracted second information signal. A control device is responsive to the error signal for reducing the extent of errors in one or more of the input signals from the transducers. An output device is responsive to the error signal and the extracted first information signal and the extracted second information signal to derive therefrom an information signal containing the least amount of errors.

In another embodiment, the apparatus includes a first transducer having at least two sensors for generating a first signal and a second signal each representative of the data containing the at least one constraint and any errors introduced into the input signals. The detector generates an error signal from one of the first signal and the second signal and extracts a first information signal and a second information signal. The output device is responsive to the error signal and at least one of the extracted first data signal and the extracted second data signal to derive therefrom an information signal containing the least amount of errors. The error signal may be used to generate a control signal for adjusting the position of the transducer. In a magnetic disc storage apparatus, the control signal may be used to adjust the read transducer position to improve alignment of a read transducer relative to a track. In a communication apparatus, the control signal may be used to adjust the direction and angle of the receiving antenna to improve reception of the electromagnetic signal.

Control information based on the extent or errors may be sent to an adjustable transmitting antenna to improve alignment of the transmitting antenna, or in other ways to reduce the extent of errors in the received signal. This may be accomplished using techniques and methods known to persons skilled in the art.

Information about the extent of errors is developed on a substantially continual basis and is not delayed until a threshold condition of errors is exceeded.

In addition, this invention includes a new, novel and unique method for using information about the extent of errors.

In its broadest aspect, the method for using information about the extent of errors in a signal comprises the steps of: (a) obtaining an input signal containing at least one constraint and any errors introduced into the input signal during transmission and/or sensing of the input signal; (b) generating with a detector in response to the input signal an error signal containing information about the extent of errors in the input signal and for extracting an information signal from the input signal as an output signal; and (c) responding to the error signal containing information about the extent of errors with a control device operatively coupled to the detector for producing a control signal for receiving the extent of errors in the input signal based on the information about the extent of errors contained in the error signal.

In one embodiment, the method comprises the steps of: (a) positioning a first transducer for generating a first signal representative of information containing at least one constraint and any errors introduced into the first signal during transmission and or sensing; (b) generating in response to the first signal an error signal containing information about the extent of errors in the first signal and extracting a first information signal; and (c) receiving the error signal and performing in response to the error signal a control function to improve the extracted data signal as a function of the extent of errors.

The method also includes the step of performing being responsive to the error signal and the first extracted information signal and the second information signal for deriving, by selection, an information extracted signal therefrom containing the least amount of errors.

The method also includes, in the step of performing, producing a control signal in response to the error signal wherein the control signal is used to adjust the position of a transducer with an adjusting element operatively coupled to the transducer.

The method includes adjusting the input signal so as to reduce the extent of errors in the input signal, including returning information about the extent of errors to the source to improve the signal generated by the source.

The present invention also has application to a storage system comprising a storage media, which may be a two dimensional surface or a three dimension volume such as a holographic memory. The storage system comprises a storage medium having located thereon predetermined storage locations storing data containing at least one constraint. A transducer is positioned relative to the storage medium for sensing the data containing the at least one constraint stored in the predetermined storage locations and generates a first signal representative of the sensed data containing the at least one constraint and any errors introduced into the sensed data during the sensing. A detector is responsive to the first signal for generating an error signal in the form of a control signal containing information about the extent of errors in the sensed data and for extracting a data signal. An output device is operatively coupled to the detector for receiving the control signal and for performing a control function in response thereto to improve the input signal obtained by the transducer from the data stored in the predetermined astorage locations.

In one embodiment, an adjustable or moveable receiving transducer receives and converts an electromagnetic signal to an electrical signal representing the input signal containing at least one constraint and any errors introduced into the input signal during transmission and/or sensing. A detector is responsive to the input signal for producing an error signal containing information about the extent of errors in the input signal during processing and extracting a data signal used as an output signal. A control device is responsive to the error signal for producing a control signal which is used to adjust the state of the receiving transducer so as to improve reception of the received electromagnetic signal.

In another embodiment, a first transducer generates an electromagnetic signal containing at least one constraint and any errors introduced into the signal during transmission. A receiving transducer receives and converts the electromagnetic signal to an electrical signal representing the input signal containing at least one constraint and any errors introduced into the input signal during the transmission and/or sensing. A detector is responsive to the input signal for producing an error signal containing information about the extent of errors in the input signal during processing and extracting a data signal used as an output signal. The control device is operatively coupled to the detector for receiving the error signal and for producing a control signal used to adjust the position of the first transducer and/or second transducer to improve transmission between the transmitting transducer and the receiving transducer which results in a reduction in the extent of errors in the input signal.

The invention covers any apparatus that uses information about the extent of errors to cause the extent of errors in the input signal to be reduced, e.g. by adjusting alignment of a head to improve head alignment relative to a track, at the same time that an output is being generated. This invention differs from the teachings of U.S. Pat. No. 5,233,487, wherein the rate of errors is first determined in order to calibrate transducer position. Thereafter, the error information is obtained without further adjustment of a head relative to a track to improve head/track alignment. The periods of calibration and adjustment are interspersed with periods in which the signal from the transducer is used to only generate an output.

The invention claims the simultaneous extraction of a data signal and generation of a control signal based on the extent of errors in one or more input signals, in which the information about the extent of errors is used dynamically to improve the transduction or in other ways to improve the quality of one or more input signals. Examples are improving the position of a head relative to a track on a disc drive while data is being recovered, or improving the position of an antenna while receiving a data transmission, based on error information from that same data bearing signal.

Therefore, one advantage of the present invention is that a novel, unique and improved device and method, and system is provided for deriving from an error signal and two or more extracted information signals an output signal containing the least amount of errors. The output signal may be derived, by selection, based on the error signal from two or more extracted information signals, or a predetermined combination thereof.

Another advantage of the present invention is that the error signal can be used to adjust a transducer or other device that produce the input signal to accommodate for a deficiency in the input signal.

Another advantage of the present invention is that the control signals can be used to adjust the position of a transducer relative to a signal source, e.g., aligning disc read/write heads in a magnetic hard disc storage system to tracks, or the direction and angle of an antenna relative to a signal source in a communication system.

A further advantage of the present invention is that the error signal can be used to provide a substantially continuous feedback of signals containing information about the extent of errors which can be used to control an actuator for positioning a transducer or otherwise adjusting the input signal.

A further advantage of the present invention is that the information about the extent of errors is developed on a current basis and error signals containing information about the extent of errors are generated at the microsecond level or better.

A still further advantage of the present invention is that information about the extent of errors may be used to select one of a plurality of sequences of data, derived from a corresponding plurality of input signals, e.g., multiple transducers such as magnetoresistive elements, or multiple receiving antennas for receiving and converting two or more input signals.

A still further advantage of the present invention is that the information about the extent of errors can be determined in response to constraints on the data signals as sensed, which constraints are implicit in or included in the data signals as originally generated. Such constraints can include error detecting or correcting codes, Partial Response Maximum Likelihood ("PRML") encoding, Run Length Limiting ("RLL") codes, or other bit encoding techniques, data formatting, or other information regarding the consistency of data signals as recorded and later sensed.

A still yet further advantage of the present invention is that the apparatus for producing the control signal can be used to generate substantially continuous feedback of signals containing information about the extent of errors in nearly real time and applying the same to an actuator for positioning a transducer relative to a signal source.

BRIEF DESCRIPTION OF THE DRAWINGS

The foregoing and other advantages of this invention will be apparent from the following description of the preferred embodiment of the invention when considered with the illustrations and accompanying drawings which include the following Figures.

DESCRIPTION OF THE PREFERRED EMBODIMENT

In order to better understand the teachings of the present invention, to set forth certain definitions that apply to the disclosure and claims as set forth herein and to provide other technical information and data, the following is provided as background for this invention.

BACKGROUND

The word "derive" as used herein means to perform one or more processing operations on one or more original electrical signals resulting in a different but related secondary signal as a derivation from one or more of the original electrical signals. For example, a derivation of an output signal from a first data signal and a second data signal with a control signal can be accomplished several ways. The simplest derivation, known as "selection", is to select, by means of a control signal, between the first data signal and the second data signal the data signal that corresponds to the least number of errors. Another example of a derivation is an output signal from a first data signal and a second data signal generated by forming a weighted average of the first data signal and the second data signal, with the weights determined by the control signal so as to produce an output signal of the least number of errors. Other derivations are well known to those skilled in the art of deriving an improved data output signal from several sensed signals of the same stored data.

A "head" is a fabricated device, which typically is in the form of a microchip, that contains one or more transducers or sensors or transducers having elements that function as read and/or write elements.

A holographic memory is a memory in which information or data is stored in the form of holographic images in photographic emulsion or other recording media.

A "position error signal" is a signal representing that a transducer is misaligned relative to a signal source, and the magnitude and direction thereof; and the processing of this signal results in an adjustment of or repositioning of the transducer relative to a source of a signal.

"PRML" is an acronym for "partial response maximum likelihood" that is a method of generating and decoding an information bearing signal or data bearing analog signal.

A "sensor" is a device for extracting an electrical signal representing an electromagnetic signal such as for example, an inductive magnet, magnetoresistive ("MR") element, an optical detector, or an antenna.

A storage medium is a storage device which may be a two dimensional medium such as a magnetic tape, rotating magnetic memory, an optical disc or a three dimensional medium such as a holographic memory.

A "transducer" is any device or element which converts an input signal into an output signal of a different form. In recording and reproducing systems a "transducer" is a device for interacting with a treated surface for recording and reproducing information on the treated surface. As used herein, the term "transducer" is intended to cover antennas, inductive heads, magnetoresistive elements, lasers, optical sensors, microphones, CCD devices and the like. Sometimes the term "sensor" is used interchangeably with the term "transducer", and in the context of this invention, a sensor is a read element or read transducer.

Information about data errors is itself a valuable signal and can be determined in response to signals produced by the transducer head, or sensor. The information about the extent of data errors can be used to dynamically and rapidly adjust the input signal to accommodate for a deficiency, to adjust the position of a transducer (such as its position relative to a data track), so as to improve operation of the information storage system or to derive an output signal as a function of the information about the extent of errors and two or more extracted information signals.

Generally, encodings that introduce or impose constraints on signals have the property that the bit string resulting from the encoding is a subset of all possible bit strings of the same length. An appearance of a disallowed bit string, i.e. one that would not be produced by the encoding, in the process of receiving the signal containing the data, shows that the recovered data violates the constraint.

Accordingly, by determining the manner in which the constraint is violated, for example with an ECC, any errors and extent of errors introduced into the signal can be ascertained, and this information used in accordance with the teachings of this invention.

An example is a Reed-Solomon type ECC encoding of a bit sequence. The ECC encoding will include both the data and the "syndrome" computed from the data (the bit sequence). This has the property that only a subset of the bit sequences whose length is the length of the data plus the syndrome is possible. If a signal containing the ECC encoded data is received, the decoding will reveal whether a correct sequence of data bits and syndrome bits is received or not. If not, than the extent of the errors in the signal can be determined, up to some number of errors that depends on the details of the ECC method.

Thus, by using the knowledge about the at least one constraint imposed on the first signal, an error signal containing information about the extent of errors can be immediately generated and used to perform a control function in accordance with the teachings of this invention.

Transducers that respond to an information bearing or data bearing electromagnetic signal can generate electrical signals that are responsive both to actual data and to errors in sensing that data. The system can dynamically determine in response to signals produced by the transducer or sensor, both the actual data and information about those errors.

Analog techniques used for encoding individual bits and sequences of bits can be used to determine both the probable actual data and one or more measures of deviation from error-free retrieval of that actual data, e.g. PRML encoding techniques for storing and retrieving data.

PRML encoding techniques are used to encode data as it is stored on a disc drive or from transmission from one antenna to another as is well known in the art. During sensing of a signal containing data recorded in PRML form using the state-of-the-art apparatus and method, the signal being received by the transducer head or sensor, e.g., an MR head or an antenna, is sampled at periodic intervals. The sample points are picked to be synchronous with the signal and sampling occurs at points where the signal is expected to take on specific values.

The present invention resides in a device and method for using information about the extent of errors introduced into the input signal during transmission or sensing for performing as a control function of at least one of adjusting the position of a transducer, such as a magnetic head or antenna, to improve alignment of the transducer relative to a signal source and deriving from the error signal and two or more extracted data signals a data signal having the least amount of errors.

Errors present in the input signal or recorded data are different than errors introduced into the input signal during transmitting and/or sensing. The disclosure and teachings of this invention relate to any errors which are introduced into the input signal during transmission and/or sensing.

DESCRIPTION OF THE FIGURES

Referring now to FIGS. 1 through 8, which describe several embodiments of the present invention, the device and method using information about the extent of errors are described hereinbelow.

Figure 1:
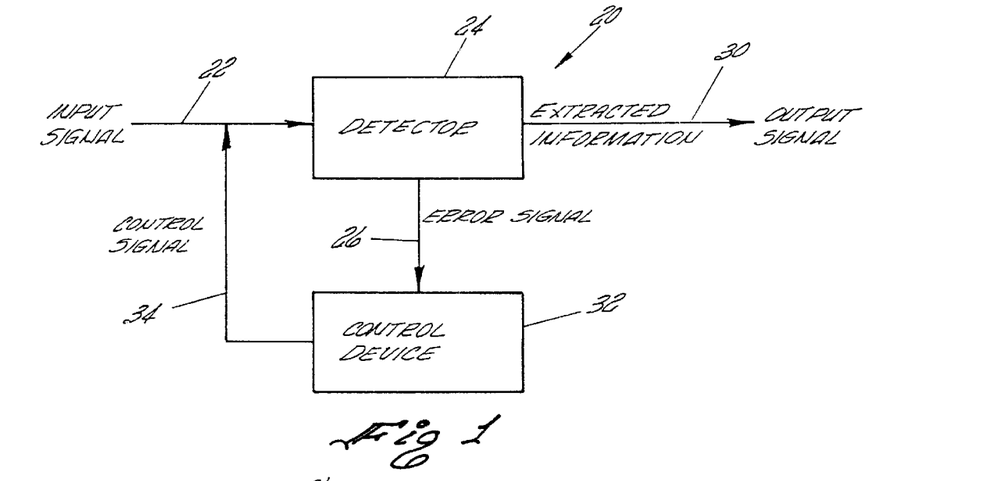
FIG. 1 is a block diagram of the device using the teachings of the present invention having an input signal, a detector and a control device for adjusting the input signal for accommodating for a deficiency in the input signal.

In the block diagram of FIG. 1, the device using the teachings of the present invention is shown generally as 20. The device receives an input signal 22 having at least one constraint and any errors introduced into the input signal during transmission and/or sensing which is being applied as the input to a detector 24. The detector 24 is responsive to the input signal 22 for generating an error signal containing information about the extent of errors, represented by lead 26, and for extracting an information signal from the input signal as an output signal represented by lead 30.

The error signal containing information about the extent of errors and represented by lead 26 is applied to a control device 32. The control device 32 is operatively coupled to the detector 24 for receiving and responding to the error signal 26 containing information about the extent of errors for generating a control signal represented by lead 34. The control signal 34 is used to reduce the extent of errors by adjusting the input signal to reduce the extent of errors therein.

Figure 2:
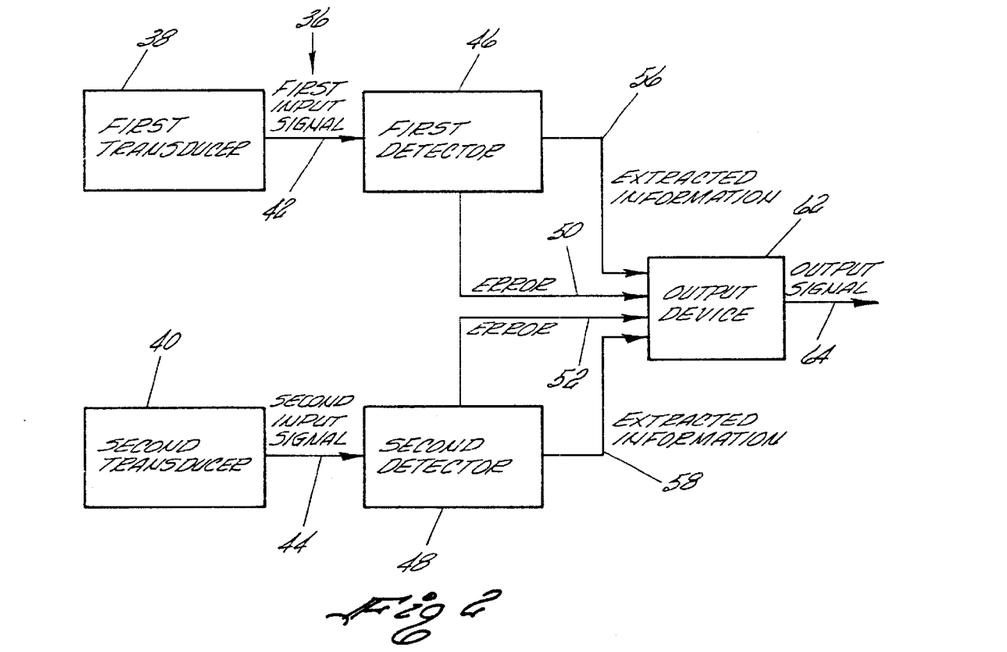
FIG. 2 is a block diagram of another embodiment of the present invention wherein the device includes a first input signal and a second input signal, which may be from a first transducer and second transducer or from a transducer having two sensors, a first detector and a second detector and an output device for producing an output signal derived from the error signals and extracted first signal and extracted second signal.

The block diagram of FIG. 2 is another embodiment of the present invention wherein the device 36 includes a first input signal 42 and a second input signal 44. The signals maybe produced by a first transducer 38 and a second transducer 40. Alternatively, the input signal could be produced by a transducer having two sensors. The first input signal 42 from the first transducer 38 contains at least one constraint and any errors introduced into the first input signal 42 during transmission and/or sensing. The second input signal 44 from the second transducer 40 contains at least one constraint and any errors introduced into the second input signal 44 during transmission and/or sensing.

A first detector 46 is responsive to the first input signal 42 while a second detector 48 is responsive to the second input signal 44. Each of the first detector 46 and second detector 48 generate an error signal containing information about the extent of errors, shown by leads 50 and 52 respectively. In addition, the first detector 46 and second detector 48 extract an information signal from its associated input signal as represented by leads 56 and 58, respectively.

An output device 62 is operatively coupled to the first detector 46 and said second detector 48 for receiving and responding to the error signals containing information about the extent of errors on leads 50 and 52 and to the extracted information signals on leads 56 and 58. The output device 62 is responsive to the error signals 50 and 52 and to the extracted information signals 56 and 58 to derive therefrom an output signal 64 that is a function of said error signals containing information about the extent of errors and extracted information signals.

One example of the derivation is to select, by use of at least two error signals, for example error signals 50 and 52, between the first extracted first information signal 56 and the extracted second information signal 58 that corresponds to the least number of errors averaged over an appropriate interval. Another example of a derivation is an output signal from the extracted first data signal 56 and a second extracted data signal 58 generated by forming a weighted average of the extracted first data signal 56 and the extracted second data signal 58 with the weights determined by the control signals 50 and 52 so as to produce an output signal of the least number of errors.

Figure 3:
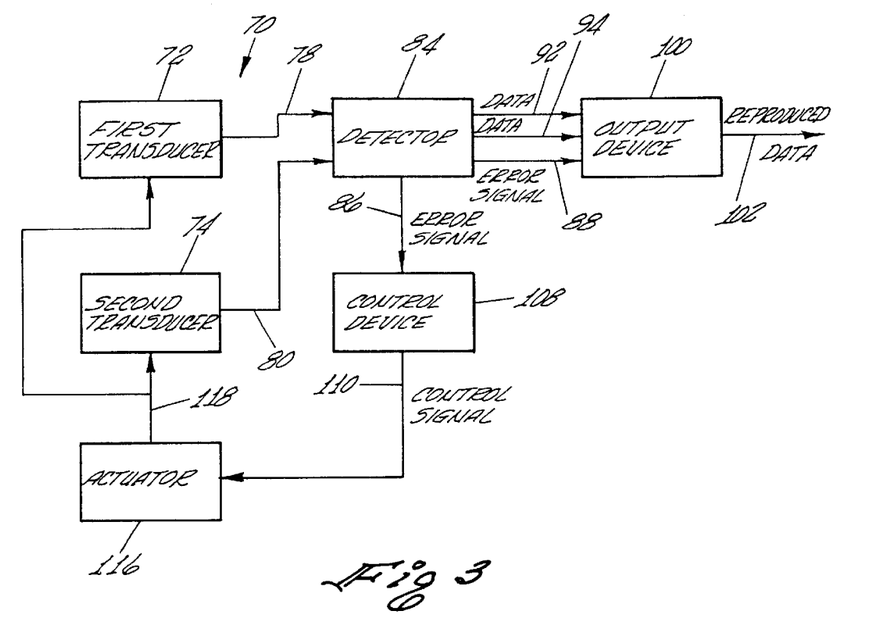
FIG. 3 is a block diagram of a device having at least two input signals from two separate transducers, a detector, an output device which receives at least two extracted data signals and an error signal for producing an output signal and a control device responsive to an error signal to produce a control signal which is applied to an adjusting element to control an actuator to adjust position of at least one of the two transducers.

FIG. 3 is a block diagram of a device 70 having a first transducer 72 and a second transducer 74 which provide at least two input signals, first input signal 78 from the first transducer 72 and second input signal 80. The first input 78 and second input 80 are applied to a detector 84. Detector 84 generates error signals 86 and 88 based on the extent of errors in the two input signals which is applied to an output device 100 and a control device 108. Error signal 84 is applied to the output device 100 and error signal 86 is applied to the control device 108. In addition, the detector 84 applies a first extracted data signal 92 and a second extracted data signal 94 to the output device 100. The detector 84 may process the input signals 78 and 80 separately or in combination to produce the signals 88, 92 and 94. The output device 100 is responsive to the error signal 86 and to the first extracted data signal 92 and a second extracted data signal 94 to produce an output signal 102 which may be one of the first extracted date signal 92 and a second extracted data signal 94, or a combination thereof based on the error signal 86.

A control device 108 is responsive to the error signal 86 received from the detector 84 to produce a control signal depicted by lead 110. The control device 108, in this embodiment, would include all electrical systems such as a servo control which are required to generate or to produce the control signal. The control signal 110 is applied to an actuator 116, which may be one or more actuators as required for adjusting the appropriate number of transducers, such as for example, two separate actuators for adjusting the position of the first transducer 72 or second transducer 74 as illustrated by lead 118.

As an example, the output device 100 can perform one or more of the following processing techniques in response to input signals 92 and 94 to generate the reproduced data:

(1) Add the components of the first signal and second signal to determine the reproduced signal; or (2) Use one or more of the components of the first signal and second signal to generate the reproduced data, such as for example, by weighing the first signal at one value and the second signal at a second value, e.g. 25% and 75%, respectively, and select, which is included in the meaning of derive, those components of each of the signal 92 and signal 94 for further processing to derive the reproduced data.

Figure 4:
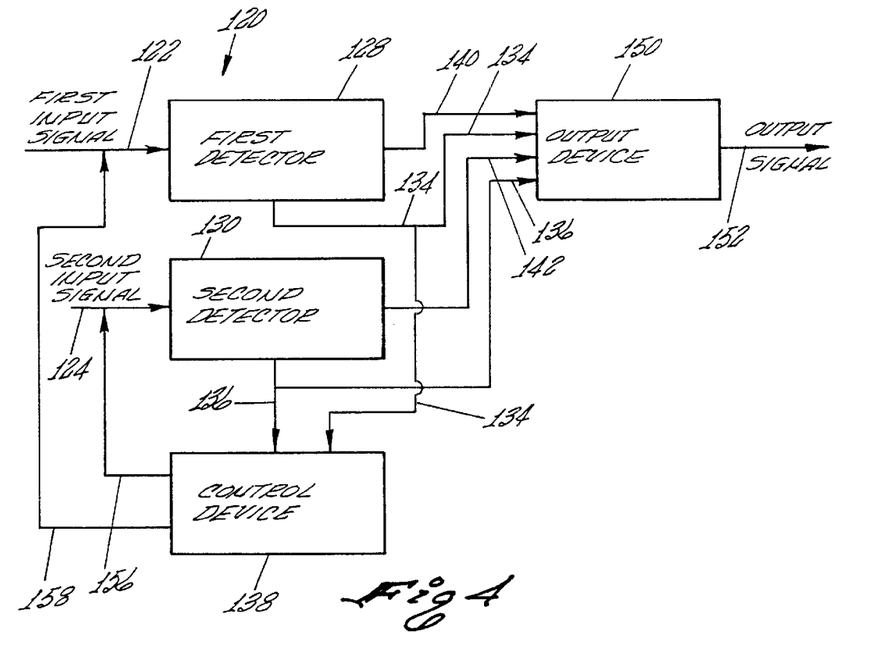
FIG. 4 is a block diagram of yet another embodiment of the present invention wherein the device include a first input signal and a second input signal, a first detector and a second detector, a control device which is responsive to two error signals for generating two control signals, for reducing the extent of errors in at least one of the first input signal and second input signal, and an output device for producing an output signal derived from the error signals and an extracted first signal and an extracted second signal.

In FIG. 4, the block diagram illustrates yet another embodiment of the present invention of a device 120 using information about the extent of errors in a signal. In FIG. 4, the device 120 includes a first input signal 122 containing at least one constraint and any errors introduced into the first input signal during transmission and/or sensing and a second input signal 124 containing at least one constraint and any errors introduced into the second input signal during transmission and/or sensing.

A first detector 128 and a second detector 134 are responsive to the first input signal 122 and the second input signal 124, respectively. Each of the first detector 128 and the second detector 130 generate an error signal containing information about the extent of errors shown by leads 134 and 136, respectively, and extracts an information signal from the input signal shown by leads 140 and 142.

A control device 138 is operatively coupled to the first detector 128 and the second detector 130 for receiving and responding to each of the error signals 134 and 136 containing information about the extent of errors for generating a control signal therefrom adjusting at least one of the first input signal 122 and the second input signal 124 to reduce the extent of errors contained therein.

An output device 150 is operatively coupled to the first detector 128 and to the second detector 130 for receiving and responding to the error signals 134 and 136 containing information about the extent of errors and the extracted information signals 140 and 142 and for deriving therefrom an output signal 152 that is a function of the error signals 134 and 136 containing information about the extent of errors and extracted information signals 140 and 142.

Figure 5:
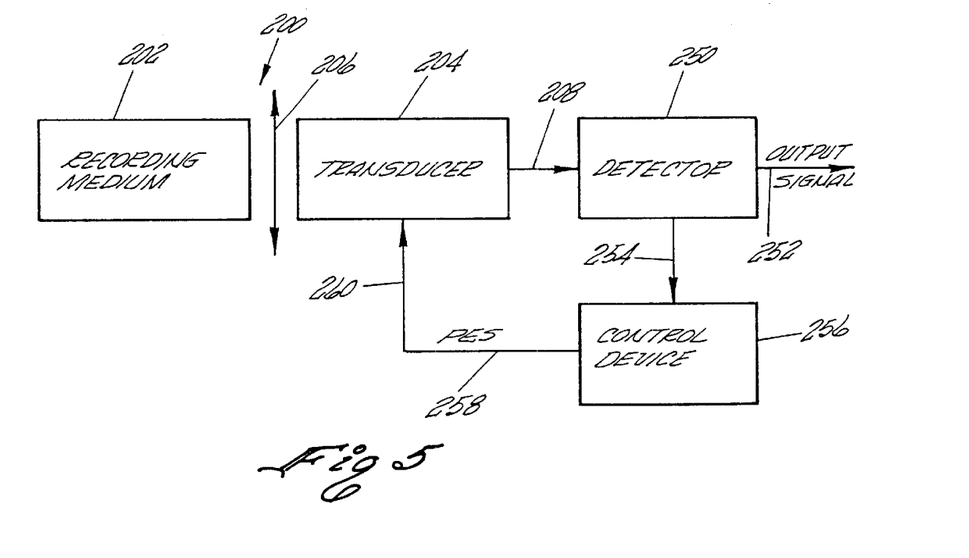
FIG. 5 is a block diagram of a storage medium containing stored data having at least one constraint and of a transducer having at least one read element for sensing the stored data and for generating a first signal containing the at least one constraint and any errors introduced into the first signal by the sensing, a detector for receiving the first signal for generating an extracted data signal and an error signal which is applied to a control device for producing a position error signal used to adjust the read element position to improve alignment of the transducer relative to a storage medium.

FIG. 5 is a block diagram of a device 200 having storage medium 202, containing stored data having at least one constraint and of a transducer 204 wherein there is relative movement therebetween as shown by arrow 206. In the embodiment illustrated in FIG. 5, the transducer 204 includes at least one read element for sensing the stored data and for generating a first signal containing at least one constraint and any errors introduced into the first signal by the sensing which is depicted by lead 208. The first signal represented by lead 208 is applied to a detector 258 for generating an extracted data signal represented by lead 252 which is used as an output signal 252, and an error signal depicted by lead 254. The error signal 254 is applied to a control device 256 for producing a position error signal, shown by arrow 258, which is used to adjust the transducer 204 position, using known adjusting devices also depicted by lead 260, to improve alignment of the transducer 204 relative to a storage medium 202.

Figure 6:
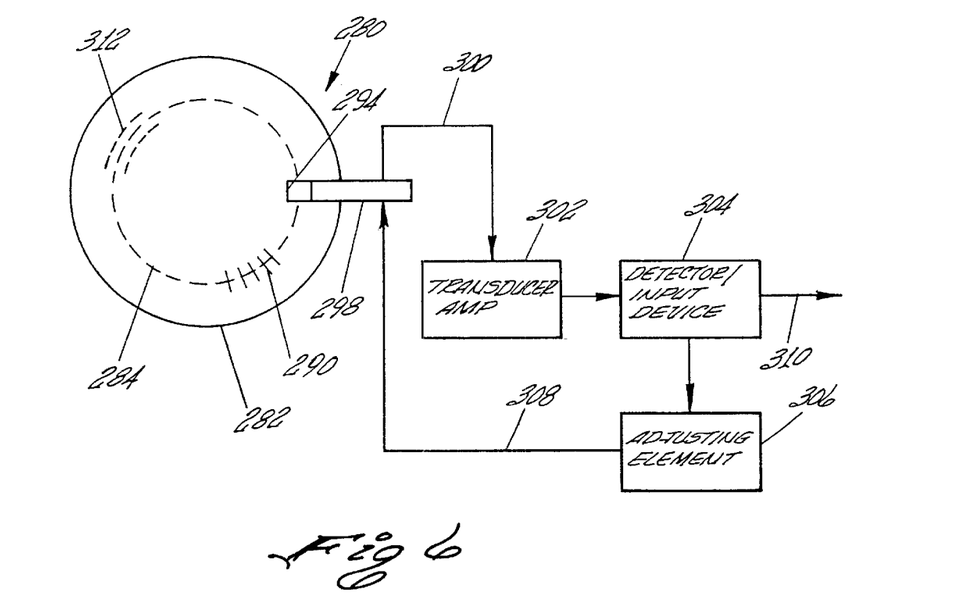
FIG. 6 is a schematic diagram of an embodiment of an apparatus having a rotating recording surface having predetermined storage locations containing data and having an arm for loading and adjusting a transducer relative to predetermined storage locations and other elements for improving extracted data signals using the teachings of the present invention.

FIG. 6, is a schematic diagram illustrating one embodiment of an apparatus for a rotating disc memory. The apparatus shown generally as 280 has a rotating recording surface 282 having a circular track shown by line 284 and having predetermined storage locations 290 storing data containing at least one constraint. A head 294 is mounted on the end of a head/loading arm 298 for loading and adjusting the head 294 relative to and in a direction to improve alignment with a track 284 relative to the predetermined storage locations 290.

In FIG. 6, the sensed data from the head 294 is applied via lead 300 to a transducer amplifier 302. The output from the transducer amplifier 302 is the first signal. The first signal is the sensed data containing the at least one constraint and any errors introduced into the sensed data during the sensing. The first signal is applied to a detector 304. The detector 304 generates a control signal containing information about the extent of errors which is used as a position error signal and applies and control signal to an adjusting element 306. The adjusting element 306 then generates a position error signal which is used to actuate the head/loading arm 298 as illustrated by lead 308 to reposition the head 294 as required in response to the position error signal. The detector 304 produces an output signal represented by lead 310, which is the extracted data signal used as the reproduced data.

In FIG. 6, the track 284 may include therein servo burst signals illustrated by lines 312. The apparatus of FIG. 6 can be used for using information about the extent of errors in combination with servo burst signals generated from prerecorded servo bursts. This device and method of the present invention can be used in combination with servo burst signals generated from the prerecorded servo bursts 312.

Figure 7:
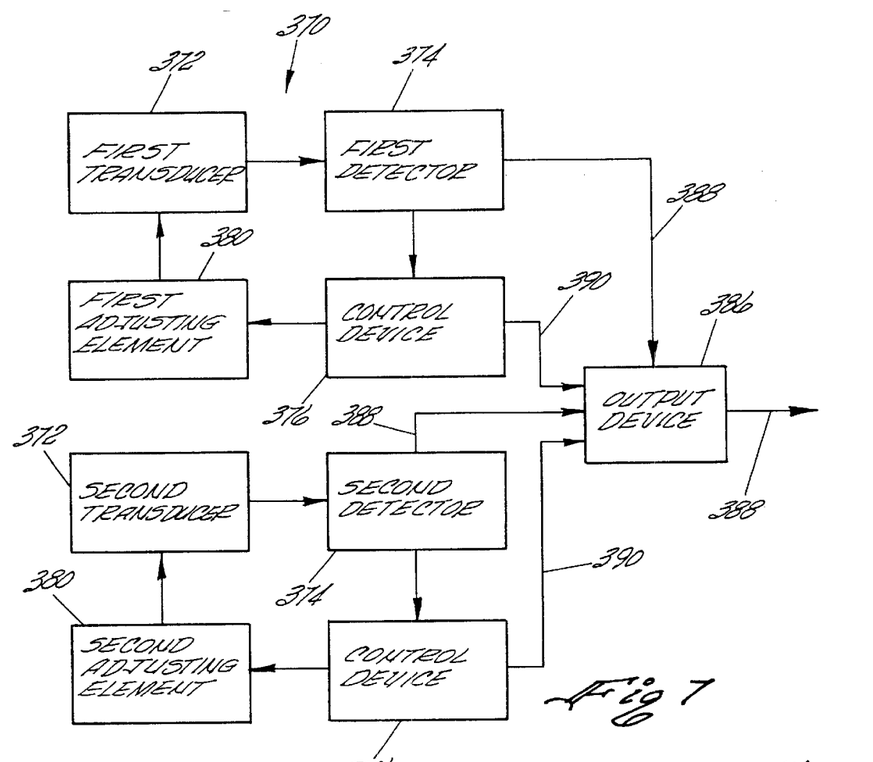
FIG. 7 is a schematic diagram of yet another embodiment of the device of the present invention having two transducers, two associated detectors, two control devices, two adjusting elements and one output device to enable the device to receive at least two input signals and to derive an output signal based on an error signal and two extracted information signals and where in control devices adjust the positions of the transducers in response to control signals developed from the error signals.

FIG. 7 is a schematic diagram of yet another embodiment of the device 370 of the present invention having two transducers 372, associated two detectors 374, two control devices 376, two adjusting elements 380 and one output device 386 which operate in a manner similar to and which generate the error signals and extracted information signals as described above in FIGS. 1, 3 and 5.

The output device 386 is responsive to the control signal 390 and the extracted information signals or extracted data signals, shown at 388 leads to derive and produce an output signal shown by lead 388.

This embodiment enables device 370 to receive at least two input signals from two transducers and to derive an output signal from at least one error signal and two extracted information signals and where each of the control devices adjusts the position of its respective transducers in response to control signal developed from an error signal.

It is envisioned the transducer described herein could be in the form of an adjustable or moveable receiving antenna wherein the position of the antenna, e.g. direction and angle, are set by an adjusting element or actuator in response to a control signal. Also, the antenna may be an array antenna having multiple elements wherein the elements are responsive to and adjusted in response to a control signal. Further, the information about the extent of errors may be returned to the source of the signal being received to allow the sender to adjust the transmitting antenna to reduce the extent of errors in the signal being received.

The invention applies to data storage systems in which writing of data may occur at the same time that data is being read. In these systems, the position of the transducer can also be controlled as a function of the extent of errors in the input signal, in the manner of this invention.

Also the entire array may be electrically adjusted in response to a control signal. The signal receiving device may be tunable to a range of frequencies and wherein the control signal determines the frequency of the carrier signal to which the receiving device is response. The signal receiving device may be adjustable as to the phase of the signal carrier and the control signal determines the phase of the carrier signal to which the receiving device is responsive. Further, the control signal may be supplied to the signal source for similar adjustments to the transmitting device.

Figure 8:
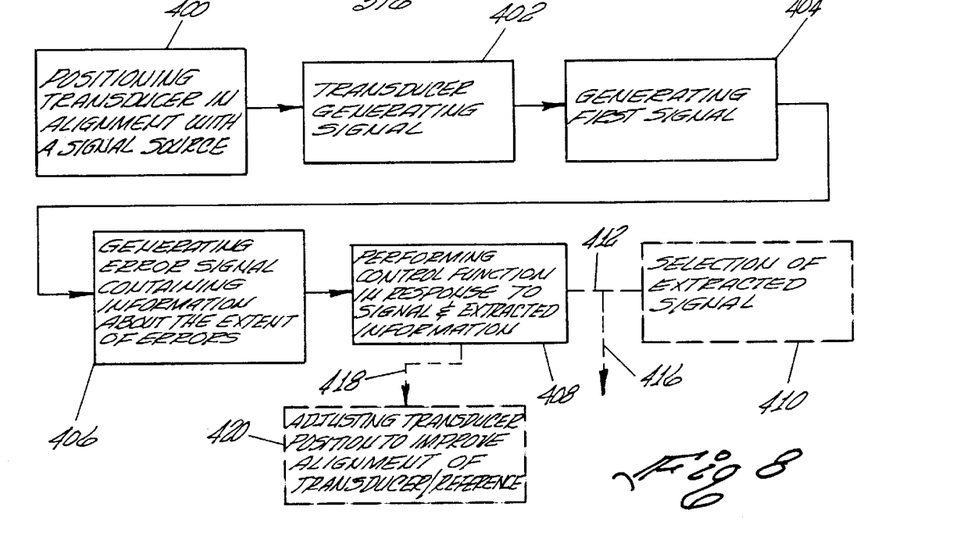
FIG. 8 is a block diagram of the various steps of a method of the present invention for using information about the extent of errors including the various steps of the method.

The block diagram of FIG. 8 illustrates the method of the present invention for using information about the extent of errors. In FIG. 8, the method comprises step 400 for positioning a transducer in alignment with a source, e.g., tracks on a storage medium or a receiving antenna in alignment with a transmitting antenna. Step 402 provides for generating from the transducer the input signal containing at least one constraint. Step 404 provides for generating from the input signal a first signal representing the input signal containing the at least one constraint and any errors introduced into the input data during transmission and/or sensing. Step 406 provides for generating in response to the first signal an error signal containing information about the extent of errors. Step 408 provides for performing in response to the error signal a control function. The control function may be Step 410 providing for electrically deriving, such as for example selecting, in response to the control signal containing information about the extent of errors and from a plurality of data signals represented by dashed line 412, if a first signal and second signal is produced, or if more than one transducer is used or if a transducer having at least two sensors is used to sense stored data, or combination of sensed data signals that contain the least number of errors and the reproduced data in the form of an extracted data signal from Step 310, all as shown by arrow 414. The reproduced data may be directly used as the output as depicted by line 416.

Another control function is shown by Step 418 comprising using the control signal containing information about the extent of errors to generate a control signal, which may be dynamic servo signal, as illustrated by lead 418 and applying the same to the adjustment element to position the transducer to improve alignment of the transducer relative to a source.

In current state-of-the-art practice, a signal received from a transducer, such as for example in a rotating magnetic memory system or an antenna, is processed using a technique known as Partial Response Maximum Likelihood ("PRML"). There are several known PRML encoding methods. The methods known as PR4 and EPR4 are commonly used. The example set forth hereinbelow is for use of the PR4 method. Use of other PRML encoding methods are similar.

In PR4 processing, the signal is sampled by an analog-to-digital converter ("ADC") at periodic intervals. The sampling is done synchronously with the signal. Since a PR4 encoding method is being used, only 3 values are expected which, for purposes of this example, are termed 1, 0 and −1, if there were no noise decreasing the signal-to-noise ratio or other effects on the signal, such as non-linear transition shifts (hereinafter referred to collectively as the "Signal Deterioration Effects", perturbing the signal. These values correspond to specific outputs of the ADC which correspond to voltages in the signals and these would be deemed the observed values of the signal. Due to the Signal Deterioration Effects, the observed values produced by sampling will differ from the 3 expected values described above. For example, instead of a voltage corresponding to a 1, as the expected value, a voltage that is 0.9 times this amount might be observed. The fact that only voltages corresponding to the 3 expected values 1, 0 and −1, would occur only under ideal conditions represents one example of a constraint on the signal that is used to generate information about the extent to which a transducer is not aligned with a signal source.

The degree to which each of the individual samples differ from the expected samples is a piece of error information. Some errors will be due to Signal Deterioration Effects, and not due to transducer misalignment. But when the amount of error in many samples in succession are observed, those due to Signal Deterioration Effects will average out or may be corrected for, and a signal representing the degree of transducer misalignment can be generated. In favorable circumstances, only a small number of samples may need to be aggregated to produce a control signal. For other circumstances, tens of thousands of samples may be required.

In accordance with the teachings of the present invention, such a signal would be a control signal containing information about the extent of errors which could be used to perform a control function as described herein.

One feature associated with use of PRML encoding is that only certain sequences of values can occur within the encoded signal or the signal containing at least one constraint. For example, in the PR4 method, not all sequences of the expected 3 values of 1, 0 and −1 will occur. The "maximum likelihood" part of the PRML encoding is used to choose a best estimate, based on the possible sequences of these values, of the theoretical values that the observed values can represent. The fact that only certain sequences of symbols will occur, and not others, is another at least one constraint that is used to estimate the extent of error.

As is well known in the art of PRML decoding, alternate sequences of possible decoded data sequences are saved until the sequence exhibiting the least extent of errors can be determined. This allows the choice of that sequence exhibiting the least extent of errors as that sequence with the maximum likelihood of having been the original recorded data sequence. The extent of error measure for the chosen sequence is then available to use in the invention as at least one component of the control signal of the invention.

In light of these constraints, the observed values are compared with known or expected values. As discussed above the observed values may differ from the expected values due to the Signal Deterioration Effects. For example, in a disc drive, one such effect may be due to the transducer rising temporarily to a greater height than normal off the disc surface due to encountering an aspersion, and then settling back to normal transducer flying height sometimes referred to as "head flying height". By computing or comparing the differences between the observed values and the expected values, the differences can be used to generate a control signal containing information about the extent of errors.

The apparatus and method of the invention include the generation of a substantially continuous control signal and the substantially simultaneous extraction of a data signal from the input signal. In this method when applied to a disc drive storage apparatus, the control signal is being derived from current data that is defined to be data that is satisfying a read request to a disc drive or data in the same track preceding a write sequence to a disc or to a track on the disc.

The step 406 generates an error signal derived from the PRML decoding of the first signal by comparing the observed sample values with the expected values produced by the PRML encoding and generates the control signal from the difference between the observed values and the expected PRML values.

SUMMARY

It is envisioned that the teachings of the apparatus, method and system as disclosed has application in the transmission and communication field as well as for storage systems. In such systems, transducers are used to transmit, receive and/or sense electromagnetic signals. In a storage system, a storage medium is moved in relation to a transducer. Examples of such storage systems include magnetic disc drives, both hard and floppy disc application, magnetic tape drives, magnetic card stripes or the like. Any storage apparatus which utilizes magnetic responses, including magnetic induction, magneto-resistive sensors, including "giant magnetoresistive" transducers, "colossal magnetoresistiven" transducers and spin-valve transducers are deemed to be within the teaching of the present invention.

In addition, it is envisioned that the teachings hereof would have utility for storage systems employing electric and other forces as sensed by an appropriate probe such as is used in atomic force microscopes and other microscanning devices.

In addition, it is envisioned that the teaching hereof would have utility for optical data storage or other storage systems including three dimensional storage systems such as holographic memories which record and reproduce stored data in predetermined storage locations.

In embodiments wherein the transducer is an adjustable receiving antenna, an adjusting element which is responsive to a dynamic servo signal may be used to improve alignment thereof relative to a fixed or adjustable transmitting antenna to optimize propagation of the electromagnetic signal over one or more propagation paths therebetween.

The signal transmitting device may include at least two moveable transmitting antennas and the signal receiving device may include at least two moveable receiving antennas any one of which is adjusted to a position by an adjusting element in response to dynamic servo signals.

Also, it is envisioned that the signal transmitting device may include at least two adjustable array transmitting antennas having multiple elements and the signal receiving device may include at least two adjustable array antennas having multiple elements wherein any of the elements are adjusted in response to dynamic servo signals. Also the entire array may be adjusted electrically.

Further, the signal receiving device may be tunable to a range of frequencies and wherein the control signal determines the frequency of the carrier signal to which the receiving device is responsive. The signal receiving device may be adjustable as to the phase of the signal carrier and the control signal determines the phase of the carrier signal to which the receiving device is responsive.

The signal receiving device may be tunable to both a range of frequencies and phases and the control signal determines the frequency and phase of the carrier signal to which the receiving device is responsive.

All of the above are envisioned to be useful for practicing the invention as disclosed herein.

What is claimed is:

1. A device using information about the extent of errors in a signal comprising
    an input signal containing information signal encoded in accordance with at least one constraint and containing any errors introduced into said input signal during at least one of transmission and sensing;
    a detector responsive to said input signal for generating in accordance with said at least one constraint a continuous error signal containing information about the extent of errors in said input signal while extracting said information signal from said input signal, said detector providing said information signal as an output signal; and
    a control device operatively coupled to the detector for receiving and responding to said error signal containing information about the extent of errors for generating a continuous control signal used to reduce the extent of errors in the input signal based on the information about the extent of errors contained in the error signal.

2. The device of claim 1 wherein the source of said input signal comprises
    a storage media having stored information containing at least one constraint; and
    a transducer responsive to said stored information for sensing said stored information containing at least one constraint and any errors introduced into said sensed stored information as a first signal.

3. The device of claim 2 wherein said detector is responsive to said first signal or generating said error signal contain information about the extent of errors and for extracting from said first signal said information signal.

4. The device of claim 3 further comprising
    an output device coupled to said detector and responsive to said error signal containing information about the extent of errors and to said extracted information signal to output said information signal and to provide said error signal to said control device.

5. The device of claim 4 wherein said transducer has at least two sensors for sensing the stored information containing at least one constraint and generating a first signal and a second signal each containing said at least one constraint and any information about errors introduced into said first signal and said second signal during sensing, wherein said detector is responsive to said first signal and said second signal for producing an error signal and for extracting a first data signal and a second data signal from said first signal and said second signal, respectively, and wherein said output device is responsive to said error signal containing information about errors and to said extracted first data signal and said extracted second data signal to select a data signal having the least number of errors.

6. The device of claim 5 said control device is responsive to said errors signal to produce a dynamic servo signal to improve alignment of said first transducer having said at least two sensors, with said predetermined storage locations concurrently with said control device deriving from the error signal and extracted first dated signal and extracted second signal a data signal containing the least amount of errors.

7. The device of claim 2 further comprising an adjusting element wherein said control device is responsive to said error signal to produce a dynamic servo signal output to said adjusting element to improve alignment of the transducer relative to predetermined storage locations.

8. The device of claim 1 further comprising a source of an input signal containing at least one constraint.

9. The device of claim 8 further comprising a signal receiving transducer responsive to a signal transmitting transducer for receiving said input signal containing at least one constraint and any information about errors introduced into said input signal during at least one of transmitting and sensing, and wherein said detector is responsive thereto for generating an error signal containing information about the extent of errors and extracting an information signal.

10. The device of claim 8 further comprising a signal transmitting transducer responsive to said input signal containing at least one constraint for propagating said information signal to said signal receiving transducer.

11. The device of claim 1 further comprising a signal receiving transducer responsive to a propagated electromagnetic signal for producing an electrical signal containing said at least one constraint and any information about errors introduced into said input signal during conversion and propagation thereof; and wherein said detector is responsive to said electrical signal to generate an error signal containing information about the extent of errors and extracting an information signal.

12. The device of claim 11 further comprising a signal transmitting transducer responsive to said input signal containing at least one constraint for producing the same as a propagated electromagnetic signal.

13. The device of claim 12 wherein said control device is responsive to said error signal to optimize receiving of said propagated electromagnetic signal from said signal transmitting transducer by adjusting said signal receiving transducer.

14. The device of claim 13 wherein said signal receiving transducer is an adjustable receiving antenna and said control signal is used to adjust said adjustable receiving antenna to optimize receiving said propagated electromagnetic signal.

15. The device of claim 14 wherein said adjustable receiving antenna is an array antenna wherein the elements of said array antenna are selectively adjusted in response to a dynamic servo signal.

16. The device of claim 14 wherein the adjustable receiving antenna includes an adjusting element which is responsive to a dynamic servo signal to improve alignment thereof relative to a source of a propagated signal to optimize propagation of said propagated electromagnetic signal over at least one propagation path.

17. The device of claim 16 further compromising at least two moveable transmitting antennas; and wherein said signal receiving antenna includes at least two moveable receiving antennas any one of which is adjusted to a position by an adjusting element responsive to a dynamic servo signal.

18. The device of claim 17 wherein said signal transmitting antenna include at least two adjustable array transmitting antennas having elements and said signal receiving antenna include at least two adjustable array antennas having elements wherein any of the elements are adjusted in response to said dynamic servo signals.

19. The device of claim 11 wherein said signal receiving transducer is at least one adjustable receiving antenna and wherein said control device is responsive to said error signal to produce a dynamic servo signal to improve alignment of said adjustable receiving antenna relative to a propagated electromagnetic signal to optimize reception of said propagated electromagnetic signal.

20. The device of claim 19 wherein said at least one adjustable receiving antenna is a moveable antenna which is adjusted to a receiving position by an adjusting element responsive to said dynamic servo signal.

21. The device of claim 19 wherein said at least one adjustable receiving antenna is an array antenna wherein the elements of said array antenna are adjusted in response to said dynamic servo signal.

22. The device of claim 19 wherein said signal receiving antenna is tunable to a range of frequencies and wherein said error signal determines the frequency of the carrier signal to which the receiving device is response.

23. The device of claim 19 wherein said signal receiving antenna is adjustable as to the phase of the a signal carrier and wherein said error signal determines the phase of the carrier signal to which the signal receiving antenna is responsive.

24. The device of claim 19 wherein said signal receiving antenna, is tunable to both a range of frequencies and phases and wherein said error signal determines the frequency and phase of a carrier signal to which the signal receiving antenna is responsive.

25. A device using information about the extent of errors in a signal comprising a first input signal containing an information signal encoded in accordance with at least one constraint and containing any errors introduced into said first input signal during at least transmission and sensing of said first input signal;

a second input signal containing an information signal encoded in accordance with at least one constraint and containing any errors introduced into said second input signal during at least transmission and sensing of said second input signal;

at least one detector responsive to said first input signal and said second input signal and generating in accordance with said at least one constraint a continuous error signal containing information about the extent of errors in said input signal while extracting at least one information signal from said first input signal and said second input signal; and an output device operatively coupled to said at least one detector for receiving and responding to said error signal containing information about the extent of errors and said extracted at least one information signal and for deriving therefrom an output signal that is a function of said error signal containing information about the extent of errors and said at least one extracted information signal.

26. The device of claim 25 further comprising at least two detectors, each of which receive as an input at least one of said first input signal and said second input signal, each of said detectors producing a continuous error signal containing information about the extent of errors in the input signal applied thereto while extracting said at least one information signal from the input signal applied thereto, and wherein said output device receives as an input the error signals and extracted information signals and derives therefrom an output signal.

27. A device using information about the extent of errors in a signal comprising a first input signal containing an information signal encoded in accordance with at least one constraint and containing any errors introduced into said first input signal during at least transmission and sensing of said first input signal;

a second input signal containing an information signal encoded in accordance with said at least one constraint and containing any errors introduced into said second input signal during at least transmission and sensing of said second input signal;

a pair of detectors each responsive to one of said first input signal and said second input signal, each of said pair of detectors generating an error signal containing information about the extent of errors in said input signal while extracting an information signal from said input signal; and an output device operatively coupled to said pair of detectors for receiving and responding to said error signals containing information about the extent of errors and said extracted information signals and for deriving therefrom an output signal that is a function of said error signals containing information about the extent of errors and extracted information signals.

28. A device using information about the extent of errors in a signal comprising a first input signal containing an information signal encoded in accordance with at least one constraint and containing any errors introduced into said first input signal during at least transmission and sensing of said first input signal;

a second input signal containing an information signal encoded in accordance with at least one constraint and containing any errors introduced into said second input signal during at least transmission and sensing of said second input signal;

a first detector and a second detector responsive to said first input signal and said second input signal, respectively, each of said first detector and said second detector generating a continuous error signal containing information about the extent of errors in said input signal while extracting an information signal from said input signal;

a control device operatively coupled to the first detector and said second detector for receiving and responding to each of said error signals containing information about the extent of errors and generating a control signal therefrom for reducing the extent of errors in at least one of said first input signal and said second input signal based on the information about the extent of errors contained in the error signal; and an output device operatively coupled to said first detector and said second detector or receiving and responding to said error signals containing information about the extent of errors and said exacted information signals and for deriving therefrom an output signal that is a function of said error signals containing information about the extent of errors and extracted information signals.

29. A device using information about the extent of errors in a signal comprising a first input signal containing an formation signal encoded in accordance with at least one constraint and containing any errors introduced into said first input signal during at least transmission and sensing of said first input signal;

a second input signal containing an information signal encoded in accordance with at least one constraint and containing any errors introduced into said second input signal during at least transmission and sensing of said second input signal;

a pair of detectors each responsive to one of said first input signal and said second input signal, each of said pair of detectors generating an error signal containing information about the extent of errors in said input signal while extracting an information signal from said input signal;

a control device operatively coupled to said pair of detectors for receiving and responding to each of said error signals containing information about the extent of errors for generating a control signal therefrom for reducing the extent of errors in at least one of said first input signal and said second input signal based on the information about the extent of errors contained in the error signal; and an output device operatively coupled to said pair of detectors for receiving and responding to said error signals containing information about the extent of errors and said extracted information signals and for deriving therefrom an output signal that is a function of said error signals containing information about the extent of errors and extracted information signals.

30. A device using information about the extent of errors in a signal comprising a first input signal containing an information signal encoded in accordance with at least one constraint and containing any errors introduced into said first input signal during at least transmission and sensing of said first input signal;

a second input signal containing an information signal encoded in accordance with at least one constraint and containing any errors introduced into said second input signal during at least transmission and sensing of said second input signal;

a first detector and a second detector responsive to said first input signal and said second input signal, respectively, each of said first detector and said second detector generating a continuous error signal containing information about the extent of errors in said input signal while extracting an information signal from said input signal; and at least one of a control device and an output device operatively coupled to the first detector and said second detector for receiving and responding to at least one of said error signals containing information about the extent of errors and at least one of said extracted information signals and wherein said control device is responsive to at least one of said error signals containing information about the extent of errors for generating a control signal therefrom for accommodating for deficiencies in at least one of said first input signal and said second input signal based on the information about the extent of errors contained in the error signal and wherein said output device is responsive to said at least one of said extracted information signals and for deriving therefrom an output signal that is a function of said one of said error signals containing information about the extent of errors and one of said extracted information signals.

31. A device using information about the extent of errors in a signal comprising a first input signal containing an information signal encoded in accordance with at least one constraint and containing any errors introduced into said first input signal during at least transmission and sensing of said first input signal;

a second input signal containing an information signal encoded in accordance with at least one constraint and containing any errors introduced into said second input signal during at least transmission and sensing of said second input signal;

a pair of detectors each responsive to one of said first input signal and said second input signal, each of said pair of detectors generating an error signal containing information about the extent of errors in said input signal while extracting an information signal from said input signal; and at least one of a control device and an output device operatively coupled to the first detector and said second detector for receiving at least one of said error signals containing information about the extent of errors and at least one of said extracted information signals and wherein said control device is responsive to at least one of said error signals containing information about the extent of errors for generating a control signal therefrom for reducing the extent of error in at least one of said first input signal and said second input signal based on the information about the extent of errors contained in the error signal and said output device is responsive to said at least one of said extracted information signals and for deriving therefrom an output signal that is a function of said error signals containing information about the extent of errors and extracted information signals.

32. A method for using information about the extent of errors in a signal comprising obtaining an input signal containing information signal encoded with at least one constraint and containing any errors introduced into said input signal during at least one of transmission and sensing;

generating with a detector in response to said input signal and said at least one constraint an error signal containing information about the extent of errors in said input signal while extracting said information signal from said input signal as an output signal; and responding to said error signal containing information about the extent of errors with a control device by producing a control signal for reducing the extent of errors in the input signal based on the information about the extent of errors contained in the error signal.

33. The method of claim 32 wherein the obtaining includes using a transducer to produce the input signal.

34. The method of claim 33 wherein the obtaining includes using a transducer in the form of a magnetic head and further includes using an adjusting element responsive to the control signal to adjust the position of the magnetic head to improve alignment of the magnetic head relative to a track.

35. The method of claim 33 wherein the obtaining includes using a receiving transducer in the form of an adjustable receiving antenna and further includes using an adjusting element responsive to the control signal to adjust the position of the adjustable receiving antenna to improve alignment of the antenna with a source.

36. The method of claim 33 wherein the obtaining includes using a first transducer in the form of a transmitting antenna and a second transducer in the form of an adjustable receiving antenna and further includes using an adjusting element for the adjustable receiving antenna responsive to a control signal to adjust the position of said adjustable receiving antenna to improve alignment therebetween to optimize signal transmission.

37. A method of using information about the extent of errors in an input signal comprising positioning a first transducer for generating a first signal representative of information encoded in accordance with at least one constraint and containing any errors introduced into the first signal during at least one of transmission and sensing;

obtaining an input signal containing said information signal encoded with at least one constraint and containing any errors introduced into said input signal during at least one of transmission and sensing;

generating in response to the first signal and the at least one constraint a continuous error signal containing information about the extent of errors in the first signal while extracting a first information signal; and performing in response to the error signal a control function to reduce the extent or errors in the input signal therein reducing the errors in an extracted data signal as a function of the extent of errors.

38. The method of claim 37 wherein the positioning includes using a second transducer to generate a second input signal and wherein at least one detector produces an extracted first information signal and an extracted second information signal and further comprising receiving the error signal and the extracted first information signal and the extracted second information signal for deriving, by selection, an information extracted signal therefrom containing a least amount of errors.

39. The method of claim 37 wherein the generating includes producing a control signal in response to the error signal wherein the control signal is used to adjust the position of a transducer with an adjusting element operatively coupled to the transducer.

* * * * *